United States Patent [19]
Katori et al.

[11] Patent Number: 5,837,356
[45] Date of Patent: Nov. 17, 1998

[54] WIRING BOARD AND METHOD FOR MANUFACTURING THE SAME

[75] Inventors: Naohiro Katori; Kiyoshi Tomita; Fujito Nakakawaji; Yoichi Sekioka; Syogo Matsuo, all of Gamou-gun; Koichi Uchimoto, Kokubu, all of Japan

[73] Assignee: Kyocera Corporation, Kyoto, Japan

[21] Appl. No.: 717,119

[22] Filed: Sep. 20, 1996

[30] Foreign Application Priority Data

| Sep. 22, 1995 | [JP] | Japan | 7-244469 |
| Sep. 22, 1995 | [JP] | Japan | 7-244470 |
| Sep. 25, 1995 | [JP] | Japan | 7-245829 |
| Dec. 7, 1995 | [JP] | Japan | 7-319025 |
| Dec. 7, 1995 | [JP] | Japan | 7-319026 |
| Dec. 14, 1995 | [JP] | Japan | 7-326033 |
| Dec. 20, 1995 | [JP] | Japan | 7-332263 |
| Dec. 20, 1995 | [JP] | Japan | 7-332264 |
| Dec. 22, 1995 | [JP] | Japan | 7-335167 |
| Dec. 22, 1995 | [JP] | Japan | 7-335168 |
| Dec. 22, 1995 | [JP] | Japan | 7-335169 |
| Dec. 25, 1995 | [JP] | Japan | 7-337500 |
| Feb. 23, 1996 | [JP] | Japan | 8-036080 |
| Feb. 23, 1996 | [JP] | Japan | 8-036081 |
| Feb. 26, 1996 | [JP] | Japan | 8-038463 |
| Feb. 26, 1996 | [JP] | Japan | 8-038464 |

[51] Int. Cl.$^6$ ............................. H01B 1/22; C09J 3/00
[52] U.S. Cl. ............... 428/210; 428/304.4; 428/320.2; 428/325; 428/327; 428/406; 428/644; 174/257; 174/258
[58] Field of Search ............................ 428/209, 210, 428/320.2, 406, 304.4, 325, 327, 644; 174/257, 258

[56] References Cited

U.S. PATENT DOCUMENTS

| 3,077,511 | 2/1963 | Bohrer et al. | 174/68.5 |
| 3,214,827 | 11/1965 | Phohofsky | 29/155.5 |
| 4,492,730 | 1/1985 | Oishi et al. | 428/901 |
| 5,314,740 | 5/1994 | Ishii et al. | 428/209 |
| 5,326,636 | 7/1994 | Durand et al. | 428/209 |
| 5,340,641 | 8/1994 | Xu | 428/209 |
| 5,346,750 | 9/1994 | Hatakeyama et al. | 428/209 |
| 5,368,921 | 11/1994 | Ishii et al. | 428/901 |
| 5,484,647 | 1/1996 | Nakatani et al. | 428/209 |
| 5,552,210 | 9/1996 | Horn, III et al. | 428/209 |
| 5,578,366 | 11/1996 | Hayashi | 428/209 |
| 5,652,042 | 7/1997 | Kawakita et al. | 428/209 |

FOREIGN PATENT DOCUMENTS 55-160072  12/1980  Japan.
57-113505  7/1982  Japan.

*Primary Examiner*—Cathy F. Lam
*Attorney, Agent, or Firm*—Loeb & Loeb LLP

[57] ABSTRACT

A wiring board constructed of an integral combination of an insulating substrate including 60–95% by weight of a powder of an inorganic insulating material and 5–40% by weight of a thermosetting resin which joins the particles of the powder of an inorganic insulating material, and an insulating substrate-coating, wiring conductor which includes 70–95% by weight of a metal powder and 5–30% by weight of a thermosetting resin.

26 Claims, 2 Drawing Sheets

WIRING BOARD AND METHOD FOR MANUFACTURING THE SAME

BACKGROUND OF THE INVENTION

1. Field of the Invention

The present invention relates to a wiring board which is used for semiconductor element-housing packages for housing semiconductor element, or hybrid integrated circuits, and a method of manufacturing the wiring board.

2. Description of the Related Art

The prior art wiring boards, for example, wiring boards which are used for semiconductor element-housing packages for housing semiconductor devices, are each constructed of an insulating substrate comprising a ceramic such as an aluminum oxide-based sinter and having a recessed portion for housing a semiconductor element in the center of a top surface thereof; and wiring conductors which extend from the periphery of the recessed portion of the insulating substrate and which are composed of a powder of a high-melting-point metal such as tungsten or molybdenum. The wiring boards are each incorporated into a semiconductor device as the finished product by firmly bonding the semiconductor element to the bottom of the recessed portion of the insulating substrate by means of an adhesive such as glass, resin or brazing material, with the respective electrodes of the semiconductor element being electrically connected to the wiring conductors by electric connection means such as bonding wires, and then joining a lid made of a material such as metal or ceramic to the top surface of the insulating substrate by means of a sealing material such as glass, resin or brazing material so as to cover the recessed portion of the insulating substrate, thus hermetically housing the semiconductor element inside the recessed portion of the insulating substrate, and the ends of the wiring conductors which are led out from the bottom of the recessed portion of the insulating substrate are connected to the wiring conductors of an external electric circuit board to electrically connect the respective electrodes of the semiconductor element to the external electric circuit board.

The wiring boards are usually manufactured by laminating ceramic green sheets; more specifically, an appropriate organic binder, solvent, etc. are added to and mixed with powders of raw materials for a ceramic, such as aluminum oxide, silicon oxide, magnesium oxide or calcium oxide, to prepare a sludge which is made into a plurality of green ceramic sheets by the well-known doctor blade method of the prior art, and the green ceramic sheets are then appropriately stamped while print-coating a metal paste to be processed into wiring conductors in a predetermined pattern. Finally, the green ceramic sheets are vertically laminated in a predetermined order to form a raw ceramic molded body which is then fired in a reducing atmosphere at a temperature as high as approximately 1,600° C.

The wiring boards of the prior art, however, have a drawback in that since a ceramic such as an aluminum oxidebased sinter which composes the insulating substrates is rigid and brittle, the wiring boards vigorously collide with each other during transportation or on the automated semiconductor device-fabricating line, or with part of the automated semiconductor device-fabricating line, and as a result, the insulating substrates chip or crack, or are otherwise broken, then the semiconductor elements are no longer hermetically housed and therefore cannot be normally and stably operated over an extended period.

In addition, the above-mentioned method of manufacturing wiring boards has a drawback in that the raw ceramic molded body nonuniformly shrink when fired and suffer from deformation such as warpage or variation in size, thus making it difficult to establish exact and reliable electric connections between the respective electrodes of the semiconductor element and the wiring conductors, or between the wiring conductors and the wiring conductors of the external electric circuit boards, and even breaking the wiring conductors when the degree of deformation or variation in size is large.

SUMMARY OF THE INVENTION

The present invention, which has been accomplished to eliminate the drawback of the prior art packages for housing semiconductor elements, is aimed at providing a wiring board which effectively prevents chipping or cracking due to application of an impact force thereto, thereby allowing the semiconductor element housed inside the package to be normally and stably operated for a long period.

It is another object of the invention to provide a method of manufacturing a wiring board which causes less deformation such as warpage or variation in size, and effectively prevents the wiring conductors from breaking, thereby allowing the electrodes of the semiconductor element or the like to be electrically connected to an external electric circuit in a reliable manner.

The invention provides a wiring board comprising: an insulating substrate comprising 60–95% by weight of a powder of an inorganic insulating material and 5–40% by weight of a thermosetting resin, wherein the powders of an inorganic insulating material are bonded with the thermosetting resin to form the insulating substrate; and wiring conductors comprising 70–95% by weight of a metal powder and 5–30% by weight of a thermosetting resin, the wiring conductors being integrally attached to the insulating substrate by coating.

Preferably, the powder of an inorganic insulating material comprises a powder of at least one member selected from the group consisting of calcium titanate, silicon oxide, aluminum oxide, aluminum nitride, silicon carbide, barium titanate, strontium titanate, titanium oxide and zeolite.

Preferably, the powder of an inorganic insulating material has a particle size within the range of 0.1–100 $\mu$m.

Preferably, the thermosetting resin of the insulating substrate comprises at least one member selected from the group consisting of an epoxy resin, a phenol resin, a polyimide resin and a polyphenylene ether resin.

Particularly preferably, the thermosetting resin of the insulating substrate is an epoxy resin which comprises at least one member selected from the group consisting of a bisphenol A epoxy resin, a novolac-type epoxy resin and a glycidyl ester-type epoxy resin.

Particularly preferably, the thermosetting resin of the insulating substrate is a polyimide resin which comprises an addition polymerization type polyimide resin.

Preferably, the thermosetting resin of the insulating substrate has an ultraviolet-Raysetting property.

Preferably, the thermosetting resin of the wiring conductors is substantially the same as the thermosetting resin of the insulating substrate.

Preferably, the thermosetting resin of the wiring conductors has an electrically conductive property.

Preferably, the metal powder of the wiring conductors has a particle size of 0.1–50 $\mu$m and comprises a powder of at least one member selected from the group consisting of copper, silver and gold, with portions of the respective particles being joined by contact with each other.

Preferably, the metal powder of the wiring conductors comprises a powder of a high-melting-point metal, with the particles of the powder being joined with a low-melting-point metal having a melting point of 300° C. or lower.

Particularly preferably, the low-melting-point metal comprises at least one member selected from the group consisting of a tin-indium alloy, a tin-zinc alloy, a tin-bismuth alloy, a lead-tin alloy and a tin-silver alloy.

Also, the metal powder of the wiring conductors preferably comprises a copper core with a particle size of 0.5–50 $\mu$m which is coated with a coating layer 0.1–0.5 $\mu$m thick of at least one member selected from the group consisting of silver, gold, platinum and palladium, or with a coating layer 0.01–10 $\mu$m thick of at least one member of aluminum and nickel, with portions of the respective particles of the powder being in contact with each other, or being joined with a low-melting-point metal having a melting point of 300° C. or lower.

Preferably, the metal powder of the wiring conductors is squamiform.

Preferably, the metal powder of the wiring conductors comprises at least two types of single element metals portions of which are joined to form alloy.

The invention also provides a method for manufacturing a wiring board which comprises the steps of:

preparing a precursor sheet by mixing 60–95% by weight of a powder of an inorganic insulating material with 5–40% by weight of a thermosetting resin precursor and preparing a metal paste by mixing 70–95% by weight of a metal powder with 5–30% by weight of a thermosetting resin precursor;

applying a predetermined pattern of the metal paste to the precursor sheet to form a wiring pattern on the precursor sheet; and heating the precursor sheet and the wiring pattern to thermally set the thermosetting resin precursor of the precursor sheet to thereby form an insulating substrate wherein the powders of an inorganic insulating material are bonded with the thermosetting resin, and concurrently to thermally set the thermosetting resin precursor of the wiring pattern to form wiring conductors wherein the metal powders are joined to each other with the thermosetting resin, and integrally attaching the wiring conductors to the insulating substrate by coating.

The invention also provides a method for manufacturing a wiring board which comprises the step of:

preparing a precursor sheet by mixing 60–95% by weight of a powder of an inorganic insulating material with 5–40% by weight of an ultraviolet-Raysetting, thermosetting resin precursor and preparing a metal paste by mixing 70–95% by weight of a metal powder with 5–30% by weight of a thermosetting resin precursor;

irradiating the precursor sheet with ultraviolet rays to semiset the ultraviolet-Raysetting, thermosetting resin precursor;

applying a predetermined pattern of the metal paste to the semiset precursor sheet to form a wiring pattern on the precursor sheet; and heating the precursor sheet and the wiring pattern to thermally set the thermosetting resin precursor of the precursor sheet to thereby form an insulating substrate wherein the powders of an inorganic insulating material are bonded with the thermosetting resin, and concurrently to thermally set the thermosetting resin precursor of the wiring pattern to form wiring conductors wherein the metal powders are joined to each other with the thermosetting resin, and integrally attaching the wiring conductors to the insulating substrate by coating.

Preferably, the glass transition temperature of the precursor sheet semiset by ultraviolet irradiation ranges from −10° to 40° C.

Preferably, the thermosetting resin precursor of the precursor sheet comprises at least one member selected from the group consisting of a bisphenol A-type epoxy resin, a novolac-type epoxy resin, and a glycidyl ester-type epoxy resin, and at least one member selected from the group consisting of an amine-based curing agent, an imidazole-based curing agent and an acid anhydride-based curing agent.

Preferably, the thermosetting resin precursor of the wiring pattern is substantially the same as the thermosetting resin precursor of the precursor sheet.

Preferably, the thermosetting resin precursor of the wiring pattern contains a polyacethylene resin or polyphenylene resin which imparts electrical conductivity thereto.

Preferably, the metal powder of the wiring pattern comprises a powder of a high-melting-point metal and a powder of a low-melting-point metal having a melting point of 300° C. or lower, or a powder of a high-melting-point metal coated with a low-melting-point metal having a melting point of 300° C. or lower; and the powder of a low-melting-point metal having a melting point of 300° C. or lower or the low-melting-point metal having a melting point of 300° C. or lower which coats the powder of a high-melting-point metal melts to join the particles of the powder of a high-melting-point metal to each other when the thermosetting resin precursor of the wiring pattern is thermally set.

Preferably, the metal powder of the wiring pattern comprises a powder of a low-melting-point metal having a melting point of 300° C. or lower, and melts to join to each other when the thermosetting resin precursor of the wiring pattern is thermally set.

Preferably, the wiring pattern contains at least one member selected from the group consisting of a fatty acid and a metal salt thereof, a metal-chelating agent, an oxydicarboxylic acid, an aminodicarboxylic acid and metal salts of the foregoing two acids.

Preferably, the wiring pattern also contains a non-solvent type diluent.

Preferably, the precursor sheet contains a thermosetting binder which comprises an epoxy-modified acrylate or carboxylic acid-modified acrylate.

Preferably, the thermosetting resin precursor of the precursor sheet and the thermosetting resin precursor of the wiring pattern are thermally set by induction heating.

Preferably, the thermosetting resin precursor of the precursor sheet and the thermosetting resin precursor of the wiring pattern are thermally set in an inert atmosphere.

With the wiring board according to the invention, since the insulating substrate is formed of a powder of an inorganic insulating material bonded with a tough thermosetting resin, the insulating substrate does not chip or crack, or is not otherwise broken even when the wiring boards vigorously collide with each other or with part of the automated semiconductor device-fabricating line.

In addition, the wiring board according to the invention, being manufactured only by thermosetting a precursor sheet comprising a mixture of a thermosetting resin precursor and a powder of an inorganic insulating material, and a metal paste comprising a mixture of a thermosetting resin precursor and a metal powder, without carrying out any firing step, is free from deformation and variation in size due to nonuniform shrinkage which is caused by firing, and thus the wiring conductors do not break. This allows reliable electric connections to be established between the electrodes of the semiconductor element, etc. and an external electric circuit by means of the wiring conductors.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
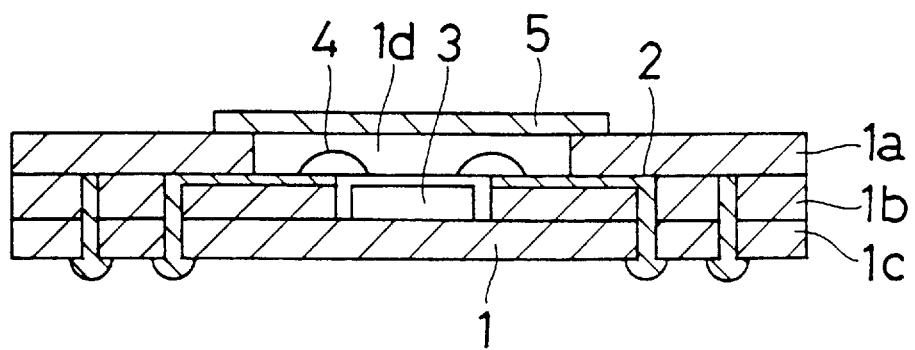
FIG. 1 is a cross sectional view illustrative of the wiring board according to an embodiment of the present invention which is used in a semiconductor element package.

Now referring to the drawings, preferred embodiments of the invention are described below.

FIG. 1 is an illustration of the wiring board according to an embodiment of the present invention which is used in a semiconductor element-housing package for housing a semiconductor element, wherein 1 is an insulating substrate, 2 is a wiring conductor, and 3 is a semiconductor element. A wiring board is completed by coating the insulating substrate with the wiring conductor 2.

The insulating substrate 1, formed of three layers of insulating plates 1a, 1b and 1c, has a recessed portion 1d for housing a semiconductor element 3 in the center of the top surface thereof, with the semiconductor element 3 firmly bonded to the bottom of the recessed portion 1d by an adhesive such as a resin.

Being composed of the three insulating plates 1a, 1b and 1c which are each formed by bonding a powder of an inorganic insulating material such as calcium titanate, silicon oxide, aluminum oxide, aluminum nitride, silicon carbide, barium titanate, strontium titanate, titanium oxide or zeolite with a tough thermosetting resin such as an epoxy resin, phenol resin, polyimide resin or polyphenylene ether resin, the insulating substrate 1 does not chip or crack, or is not otherwise broken even when an external force is exerted thereon.

Particularly, since calcium titanate is highly resistant to chemicals, the insulating substrate 1 has increased resistance to chemicals when calcium titanate is used as the powder of an inorganic isulating material chemicals, and this effectively prevents corrosion of the insulating substrate 1.

The incorporation of an inorganic fiber or organic fiber such as a potassium titanate whisker, aluminum borate whisker, calcium silicate whisker, carbon or aromatic polyamide into the insulating substrate 1 in addition to the powder of an inorganic insulating material greatly improves the resistance to heat and chemicals and heat radiation of the insulating substrate 1 while increasing a mechanical strength thereof.

The inorganic fiber or organic fiber incorporated into the insulating substrate 1 makes it difficult to increase the strength of the insulating substrate 1 and to bring the heat expansion coefficient of the insulating substrate 1 closer to the heat expansion coefficient of the semiconductor element 3 in cases where the fiber is shorter than 5 μm, whereas large asperities are formed on the surface of the insulating substrate 1 and make it difficult to form a predetermined coat of the wiring conductor 2 on the surface of the insulating substrate 1 with precision when the fiber is longer than 100 μm. Accordingly, the inorganic fiber or organic fiber being incorporated into the insulating substrate 1 preferably has a length within the range of 5–100 μm.

Preferably, the epoxy resin being used as the thermosetting resin comprises at least one member selected from the group consisting of a bisphenol A-type epoxy resin, a novolac-type epoxy resin and a glycidyl ester-type epoxy resin. More preferably, the epoxy resin is used in combination with a curing agent, such as an amine-based curing agent, imidazole-based curing agent or acid anhydride-based curing agent, added thereto. Also, preferably, the polyimide resin being used as the thermosetting resin is a bismaleide-based addition polymerization type polyimide resin. It is also preferred that an ultraviolet-Raysetting, thermosetting resin, for example, an acryl-modified epoxy resin (epoxy-modified acrylate resin) or the like is used as the thermosetting resin.

Here, in cases where the three insulating plates 1a, 1b and 1c, which construct the insulating substrate 1 which comprises the powder of an inorganic insulating material bonded with a thermosetting resin, contain less than 60% by weight of the powder of an inorganic insulating material, the heat expansion coefficient of the insulating substrate 1 greatly differs from the heat expansion coefficient of the semiconductor element 3, and this causes the semiconductor element 3 to generate heat while operating, thereby producing a large thermal stress due to the difference in heat expansion coefficient between the two when the heat is applied to both the semiconductor element 3 and the insulating substrate 1; the large thermal stress causes the semiconductor element 3 to peel off from the insulating substrate 1 or to crack, or to be otherwise broken. On the other hand, the powder of an inorganic insulating material cannot be completely bonded with the thermosetting resin, and thus the predetermined insulating plates 1a, 1b and 1c cannot be obtained when the content exceeds 9.5% by weight. Therefore, the insulating plates 1a, 1b and 1c which constructs the insulating substrate 1 should each contain 60–9.5% by weight of the powder of an inorganic insulating material.

In addition, the particles of the powder of an inorganic insulating material in the insulating substrate 1 tend to agglomerate and nonuniformly disperse when the particle size of the contained powder of an inorganic insulating material is smaller than 0.1 μm, whereas large asperities are formed on the surface of the insulating substrate 1 when the particle size exceeds 100 μm, which makes it difficult to attach by coating the wiring conductors on the surface of the insulating substrate 1 with precision. Accordingly, the particle size of the powder of an inorganic insulating material which is contained in the insulating substrate 1 should be within the range of 0.1–100 μm.

The wiring conductor 2 which extends from the periphery of the recessed portion 1d of the insulating substrate 1 is attached to the insulating substrate 1 by coating, and is composed of a powder of a metal, for example, copper, silver or gold, bonded with a thermosetting resin.

The wiring conductor 2 serves to electrically connect each of the electrodes of the semiconductor element 3 to an external electric circuit; each of the electrodes of the semiconductor device 3 is electrically connected to the end of the wiring conductor 2 at the periphery of the recessed portion 1d of the insulating substrate 1 by means of a bonding wire 4, while the end of the wiring conductor 2 at the underside of the insulating substrate 1 is electrically connected to the external electric circuit.

The wiring conductor 2 composed of a metal powder bonded with a thermosetting resin tends to have increased electrical resistance when the metal powder content is lower than 70% by weight, whereas the contents exceeding 95% by weight could make it difficult to firmly bond the metal powder with the thermosetting resin to thereby form the predetermined wiring conductor 2. Accordingly, the metal powder content of the wiring conductor 2 should be within the range of 70–95% by weight.

In addition, the metal powder which composes the wiring conductor 2 comprises a powder of at least one member selected from the group consisting of copper, silver and gold. The particles of the metal powder tend to agglomerate and nonuniformly disperse when the average particle size is smaller than 0.1 μm, whereas the average particle sizes exceeding 50 μm could make it difficult to print the wiring conductor 2 with a width within the conventional range of 50–200 μm. Accordingly, the metal powder which is contained in the wiring conductor preferably has an average particle size within the range of 0.1–50 μm. The particles of the metal powder are joined to form the wiring conductor 2, with portions of the respective particles being in contact with each other.

According to another embodiment, the wiring conductor 2 may be formed by attaching the particles of a powder of a high-melting-point metal, such as copper, silver or gold, which have been joined with a low-melting-point metal having a melting point of 300° C. or lower, specifically solder, to the insulating substrate 1 by means of a thermosetting resin. The surface of a powder of a high-melting-point metal may be coated with a low-melting-point metal having a melting point of 300° C. or lower according to a modification of the present embodiment. According to another modification thereof, the wiring conductor 2 may also be formed of a metal material which is formed by melting powders of a low-melting-point metal having a melting point of 300° C. or lower (e.g., eutectic solder) to join each other. In these two cases, the electric connections between the particles of the metal powder are particularly reliably established to lower the electrical resistance of the wiring conductor 2. Here, the total amount of the powder of a high-melting-point metal and the low-melting-point metal (powder) having a melting point of 300° C. or lower should be within the range of 70–95% by weight of the total amount of the wiring conductor 2 for the same reason as described above. Preferably, the average particle sizes of the powder of a high-melting-point metal and the powder of a low-melting-point metal having a melting point of 300° C. or lower are within the range of 0.1–50 μm for the same reason as described above.

The low-melting-point metal should have a melting point of 300° C. or lower, since it becomes difficult to join the particles of the powder of a high-melting-point metal without thermally damaging the insulating substrate 1 when the melting point exceeds 300° C.

In addition, in cases where the powder of a high-melting-point metal comprises lower than 20% by weight of the total amount of the metal powder and the low-melting-point metal having a melting point of 300° C. or lower, the low-melting-point metal is present in excess relative to the metal powder, and thus the particles of the low-melting-point metal tend to melt, which prevents an integral combination incorporating the metal powder from being formed, and could increase the electrical resistance of the wiring conductor 2. On the other hand, when the proportion exceeds 80% by weight, since the amount of the low-melting-point metal being used to join the particles of the metal powder relatively decreases, the particles of the metal powder cannot be completely joined, and this tends to increase the electrical resistance of the wiring conductor 2. Accordingly, the metal powder which is contained in the wiring conductor 2 preferably comprises 20–80% by weight of the total amount of the metal powder and the low-melting-point metal.

The low-melting-point metal includes a tin-indium alloy, tin-bismuth alloy, tin-zinc alloy, lead-tin alloy, tin-silver alloy, etc., at least one member of which is used.

According to yet another embodiment of the invention, the wiring substrate 2 may be formed by attaching a metal powder, which is prepared by coating the surface of a copper core with a coating layer comprising at least one member selected from the group consisting of silver, gold, platinum and palladium, to the insulating substrate 1 by means of a thermosetting resin. Here, al low-melting-point metal having a melting point of 300° C. or lower may also be incorporated therein likewise the embodiments described above.

With the metal powder prepared by coating the surface of a copper core with a coating layer comprising at least one member selected from the group consisting of silver, gold, platinum and palladium, the copper core serves as the main conductor of the wiring conductor 2, and the core-coating layer comprising at least one member selected from the group consisting of silver, gold, platinum and palladium prevents oxidation of the surface of the metal powder to reduce the contact resistance of the particles of the metal powder. Since copper powder is highly conductive, the electrical resistance of the wiring conductor 2 becomes low.

The metal powder, being formed by coating the surface of a core made of inexpensive copper with a coating layer comprising at least one member selected from the group consisting of silver, gold, platinum and palladium, is less expensive than the metal powder consisting only of a noble metal such as silver, gold, platinum or palladium, and this allows provision of an inexpensive board.

Since the metal powder is formed by coating the surface of a copper core with a coating layer comprising at least one member selected from the group consisting of silver, gold, platinum and palladium which resist oxidation, its surface resists oxidation, and this prevents the contact resistance of the particles of the metal powder which is contained in the wiring conductor 2 from increasing, and facilitates eletrically connecting the semiconductor element inside the package to an external electric circuit with efficiency. Here, the metal powder content of the wiring conductor 2 should be within the range of 70–95% by weight for the same reason as described above.

The copper which composes the metal powder tends to increase the contact resistance of the particles of the metal powder and eventually the electrical resistance of the wiring conductor 2 when its average particle size is smaller than 0.5 μm, whereas it tends to make it difficult to form the wiring conductor 2 with a width within the conventional range of 50–200 μm in a predetermined pattern. Accordingly, the average particle size of the copper preferably is within the range of 0.5–50 μm.

The coating layer comprising at least one member selected from the group consisting of silver, gold, platinum and palladium tends to fail to sufficiently prevent the surface of the copper core from being oxidized when its thickness is smaller than 0.1 μm, and the cost of the metal powder greatly increases when the thickness exceeds 0.5 μm. Accordingly, with the metal powder prepared by coating the surface of a copper core with a coating layer comprising at least one member selected from the group consisting of silver, gold, platinum and palladium, the thickness of the coating layer preferbly is within the range of 0.1–0.5 µm.

According to yet another embodiment of the invention, the wiring conductor 2 may be formed by attaching a metal powder, which is prepared by coating the surface of a copper core with a coating layer comprising at least one of aluminum and nickel, to the insulating substrate 1 by means of a thermosetting resin.

Since the surface is coated with aluminum or nickel which is highly resistant to corrosion, the surface of the copper powder which is contained in the wiring conductor 2 is hardly oxidized, and this results in ever lower electrical resistance of the wiring conductor 2.

The metal powder content of the wiring conductor 2 should be within the range of 70–95% by weight for the same reason as described above.

The average particle size of the copper composing the metal powder preferably is within the range of 0.5–50 µm for the same reason as described above.

In addition, when the thickness of the aluminum or nickel coating the surface of the copper powder is smaller than 0.01 µm, the surface of the copper powder cannot be completely coated with aluminum or nickel, and this makes it difficult to effectively prevent the copper powder from being oxidized, whereas the electrical resistance of the wiring conductor 2 tends to increase when the thickness exceeds 10 µm. Accordingly, the surface of the copper powder being used for the preparation of the wiring conductor 2 is preferably coated with aluminum or nickel having a thickness within the range of 0.01–10 µm.

The particles of the metal powder comprising a copper core the surface of which is coated with a coating layer comprising at least one member selected from the group consisting of silver, gold, platinum and palladium, or at least one of aluminum and nickel, are joined to each other to form the wiring conductor 2, with portions of the respective particles being in contact with each other. Alternatively, the particles of the metal powder may be joined with a low-melting-point metal having a melting point of 300° C. or lower, to form the wiring conductor 2.

Further, in order to coat the surface of the copper core with a coating layer comprising at least one member selected from the group consisting of silver, gold, platinum and palladium, or at least one of aluminum and nickel, a coat of silver, gold, platinum, palladium, aluminum or nickel is formed on the surface of the copper core by the well-known displacement plating method of the prior art.

According to yet another embodiment of the invention, the wiring conductor 2 may be formed by attaching the squamiform particles of the metal powder to the insulating substrate 1 by means of a thermosetting resin. Here, particularly preferably, portions of the respective particles of the metal powder are joined by soldering.

When the metal materials which compose the wiring conductor 2 are formed by joining portions of the respective squamiform particles of the metal powder by means of solder, the solder joints between the respective particles of the metal powder are formed reliably and easily since the respective particles of the metal powder are squamiform, and this establishes reliable electric connections between the respective particles of the metal powder, thereby lowering the electrical resistance of the wiring conductor 2. Particularly, when the metal powder is formed of silver, since the electrical resistance of silver is extremely low, the electrical resistance of the wiring conductor 2 is further lowered.

In addition, in cases where the squamiform particles of the metal powder are formed of silver, and the surfaces are coated with a fatty acid, production of unwanted oxides on the surface of the metal powder and eventual reduction in joining strength of the solder are effectively prevented. This results in reliable joining of portions of the respective particles of the metal powder by means of the solder, and in lower electrical resistance of the resulting wiring conductor 2.

In addition, regarding the relationship between the metal powder comprising squamiform particles and the solder powder, in cases where the weight ratio of the solder powder to the metal powder is lower than 1:10, the amount of the solder powder is small relative to the amount of the metal powder, the metal powder cannot be satisfactorily soldered, and the electrical resistance of the resulting wiring conductor 2 tends to increase. On the other hand, in cases where the ratio is higher than 1:1, the solder powders tend to melt to join each other, which prevents an integral combination incorporating the metal powder from being formed, and could increase the electrical resistance of the resulting wiring conductor 2. Accordingly, the weight ratio of the solder powder to the metal powder comprising squami-form particles preferably is within the range of 1:10 to 1:1

Furthermore, the squamiform particles of the metal powder tend to agglomerate and nonuniformly disperse, and eventually the electrical resistance of the formed wiring conductor 2 increases when the maximum length of the particles is smaller than 0.1 µm, whereas the metal paste which will be described later cannot be finely printed, and thus it becomes difficult to form the wiring conductor 2 having a width within the conventional range of 50–200 µm. Accordingly, the squamiform particles of the metal powder preferably have a maximum length within the range of 0.1–50 µm.

Also, the squamiform particles of the metal powder tend to agglomerate and nonuniformly disperse, and eventually the electrical resistance of the formed wiring conductor 2 increases when the maximum thickness of the particles is smaller than 0.01 µm, whereas the particles resist arrangement with broader surfaces thereof being faced to each other, which could make it difficult to reliably join portions of the respective particles of the metal powder, and could increase the electrical resistance of the wiring conductor 2. Accordingly, the squamiform particles of the metal powder preferably have a maximum thickness within the range of 0.01–10 µm.

On the other hand, when the particles of the solder powder are spherical and the particle size is set within the range of 1–50 µm, the particles of the solder powder easily penetrate the spaces between the squamiform particles of the metal powder to reliably join portions of the respective particles of the metal powder. Accordingly, the particles of the solder powder are preferably spherical, and the particle size is preferably set within the range of 1–50 µm. The total amount of the metal powder composed of squamiform particles and the solder powder should comprise 70–90% by weight of the total amount of the wiring conductor 2 for the same reason as described above.

According to yet another embodiment of the invention, the wiring conductor 2 may be formed by attaching particles of a metal powder comprising at least two types of single element metals, with portions of the respective particles being joined by alloying, to the insulating substrate 1 by means of a thermosetting resin. Here, since reliable electric connections are established between the particles of a metal powder comprising at least two types of single element metals, the electrical resistance of the wiring conductor 2 is low. The particles of a metal powder comprising at least two types of single element metals are preferably formed by using at least one member selected from the group consisting of gold, germanium, magnesium, manganese, praseodymium, antimony, silver and aluminum in combination with copper, or at least one member selected from the group consisting of lead, tin and gold, in combination with bismuth, or at least one of silver and lead, in combination with lithium, or at least one of tin and antimony in combination with gold, or magnesium and zinc, or lead and tin, or the like. The respective element metals used are preferably combined in the same proportions to prepare the wiring conductor 2, and the connections between the particles are ensured by alloying.

With the wiring conductor 2 formed by joining particles of a metal powder, which comprises at least two types of single element metals, with a thermosetting resin, the joining of the particles of the metal powder of at least two types of single element metals through alloying tends to become imperfect in cases where the amount of the metal powder comprising at least two types of single element metals is smaller than 70% by weight of the total amount of the wiring conductor 2. On the other hand, when the proportion exceeds 95% by weight, it is difficult to firmly coat the insulating substrate 1 with the formed wiring conductor 2 using a thermosetting resin, and further the wiring conductor 2 tends to be brittle. Accordingly, the amount of the metal powder comprising at least two types of single element metals preferably is within the range of 70–95% by weight of the total amount of the wiring conductor 2.

The particle size of each of the particles of the metal powder comprising at least two types of single element metals which is contained in the wiring conductor 2 preferably is within the range of 0.1–50 $\mu$m for the same reason as described above.

Although the thermosetting resin to be incorporated into the wiring conductor 2 may be the same as or different from the thermosetting resin used for joining the powder of an inorganic insulating material, the two preferably are the same. Particularly, a conductive thermosetting resin is preferably used. The conductive resin available for use includes polypyrrole resins, poly-paraphenylene resins, polyaniline resins, polyacetylene resins, polyphenylene resins, etc.; any of these conductive resins may be used in admixture with a thermosetting resin such as an epoxy resin. Since the conductive resin ensures the electric connections between the particles of the metal powder, the electrical resistance of the wiring conductor 2 is low.

In addition, when a phenol resin is used as the thermosetting resin, the phenol resin joining the metal powder in the wiring conductor 2, for example, copper powder, effectively prevents the surface of the metal powder from being oxidized, which ensures the electric connections between the particles of the metal powder to improve the antimigration characteristics, high-frequency characteristics, etc. In addition, when an addition polymerization type polyimide resin is used as the thermosetting resin, no water is produced in the thermosetting step which will be described later. Accordingly, the wiring conductor 2 may be firmly bonded to the insulating substrate 1 without causing swelling.

When the exposed surface of the wiring conductor 2 is coated with a highly corrosion-resistant, highly conductive metal, such as nickel or gold, to a thickness of 1.0–20 $\mu$m by plating, the oxidative corrosion of the wiring conductor 2 is effectively prevented, and further a reliable electric connection is established between the wiring conductor 2 and the bonding wire 4. Accordingly, the exposed surface of the wiring conductor 2 is preferably coated with a 1.0–20 $\mu$m thick layer of a highly corrosion-resistant, highly conductive metal, such as nickel or gold, by plating.

As described above, according to the invention, a semiconductor device is fabricated as a product by firmly bonding the semiconductor element 3 to the bottom of the recessed portion 1$d$ of the insulating substrate 1, electrically connecting each of the electrodes of the semiconductor element 3 to the wiring conductor 2 by means of the bonding wire 4, and finally bonding the lid 5 to the upside of the insulating substrate 1 by means of a sealing material, thus hermetically housing the semiconductor element 3 inside the container constructed of the insulating substrate 1 and the lid 5.

Figure 2A:
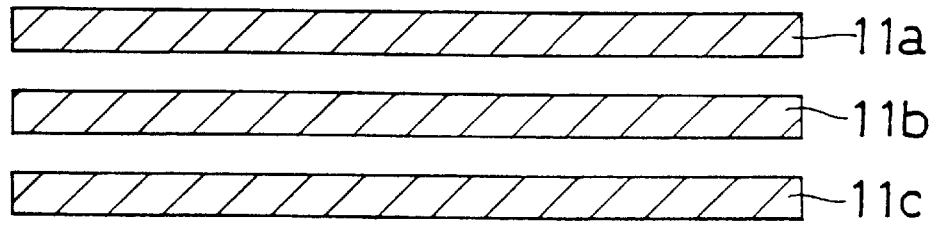
FIGS. 2A, B and C are cross sectional views illustrative of the steps of a method of manufacturing the wiring board according to the invention.

Examples will now be presented to describe the method of manufacturing a wiring board for use in packages for housing semiconductor elements, with reference to FIGS. 2A, B and C. A variety of wiring boards may be manufactured according to the methods of the invention, which may be broadly divided into two types, using combinations of the powder of an inorganic insulating material, thermosetting resin, metal powder and other additives disclosed above. Accordingly, although the raw materials are specified in the following typical examples to describe the manufacturing methods in detail, use of raw materials not referred to in the examples to manufacture wiring boards of desired qualities is also within the technical scope of the present invention which is apparent to those skilled in the art.

Example 1

As illustrated in FIG. 2A, particles of a powder of an inorganic insulating material are joined with a thermosetting resin to provide three precursor sheets 11$a$, 11$b$ and 11$c$.

The three precursor sheets 11$a$, 11$b$ and 11$c$ are prepared by mixing a powder of an inorganic insulating material, such as silicon oxide or aluminum oxide, which has a particle size on the order of 0.1–100 $\mu$m, with an epoxy resin such as a bisphenol A-type epoxy resin, novolac-type epoxy resin or glycidyl ester-type epoxy resin, and a curing agent such as an amine-based curing agent, imidazole-based curing agent or acid anhydride-based curing agent added thereto, to prepare a paste which is then made into sheets, and semisetting the sheets by heating at a temperature from about 25 to about 100° C. for 1–60 minutes.

Figure 2B:
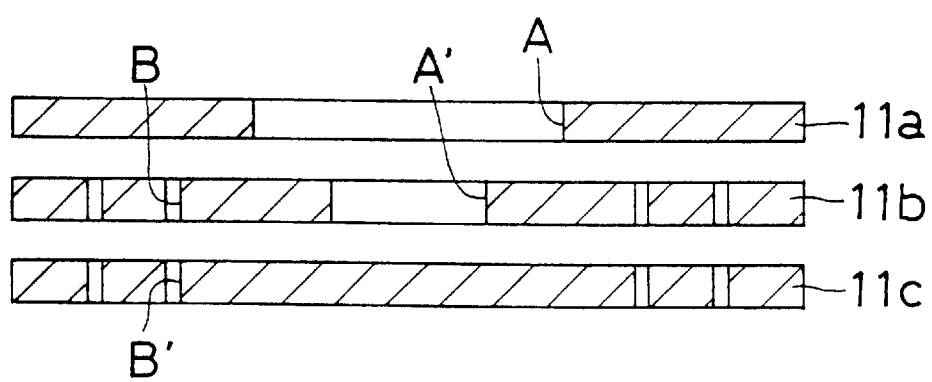

Then, as illustrated in FIG. 2B, of the three semiset precursor sheets 11$a$, 11$b$ and 11$c$, the two precursor sheets 11$a$ and 11$b$ are bored to form openings A and A' which constitute the recessed portion id, and the two precursor sheets 11$b$ and 11$c$ are each perforated to form through-holes B and B' for routing the wiring conductor 2.

The openings A and A' and the through-holes B and B' are formed by processing the precursor sheets 11$a$, 11$b$ and 11$c$ by the well-known punching method of the prior art, and by making holes of predetermined shapes in each of the precursor sheets 11$a$, 11$b$ and 11$c$.

Figure 2C:
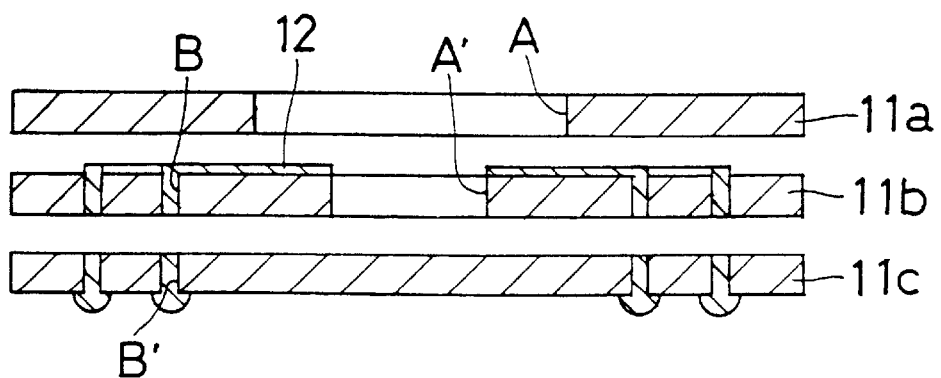

Then, as illustrated in FIG. 2C, the metal paste to be processed into the wiring conductor 2 is print-coated on the upside and underside of the semiset precursor sheets 11$b$ and 11$c$, and on the inside of the through-holes B and B' in a predetermined pattern by the well-known screen printing method and filling method of the prior art, and the composite is semiset by heating at a temperature from about 25 to about 100° C. for 1–60 minutes.

The metal paste 12 to be processed into the wiring conductor 2 may be a paste which is prepared by mixing a copper powder having a particle size on the order of 0.1–20 μm, with an epoxy resin such as a bisphenol A-type epoxy resin, novolac-type epoxy resin or glycidyl ester-type epoxy resin, and a curing agent such as an amine-based curing agent, imidazole-based curing agent or acid anhydride-based curing agent added thereto.

Finally, the three semiset precursor sheets 11a, 11b and 11c are vertically laminated and heated at a temperature from about 80 to about 300° C. for about 10 seconds to 24 hours to completely thermoset the thermosetting resin precursors in the precursor sheets 11a, 11b and 11c, and the thermosetting resin precursor in the metal paste 12 print-coated on the precursor sheets 11b and 11c in the predetermined pattern, thereby completing a wiring board comprising the insulating substrate 1 with the wiring conductor 2 attached thereto by coating, as illustrated in FIG. 1. Here, the precursor sheets 11a, 11b and 11c and the metal paste 12 hardly shrink when thermoset, and therefore the resulting wiring board hardly suffers from deformation or variation in size.

Example 2

When an ultraviolet-Raysetting, thermosetting resin is used as the thermosetting resin for the insulating substrate 1, the three precursor sheets 11a, 11b and 11c in Example 1 are prepared by mixing a powder of silicon oxide having a particle size on the order of 0.1–100 μm, with an epoxy-modified acrylate resin added thereto, to prepare a paste which is then made into sheets by a sheet-forming method such as the doctor blade method. Each of the three precursor sheets 11a, 11b and 11c is irradiated with ultraviolet rays to be semiset to solids having a glass transition temperatures within the range of −20° to 40° C., for example. Since the precursor sheets 11a, 11b and 11c are semiset by irradiation with ultraviolet rays, the semiset states having glass transition temperatures within the range of −20° to 40° C. may be achieved very precisely and easily.

So long as being in the semiset states having glass transition temperatures within the range of −20° to 40° C., the semiset precursor sheets 11a, 11b and 11c do not suffer from deformation or cracking when stamped, and the predetermined pattern of the metal paste may be printed on the precursor sheets 11a, 11b and 11c with high precision.

Then, as illustrated in FIG. 2B, of the three semiset precursor sheets 11a, 11b and 11c, the two precursor sheets 11a and 11b are bored to form openings A and A' which constitute the recessed portion id, and the two precursor sheets 11b and 11c are each perforated to form through-holes B and B' for routing the wiring conductor 2.

The openings A and A' and the through-holes B and B' are formed by processing the precursor sheets 11a, 11b and 11c by the well-known punching method of the prior art, and by making holes of predetermined shapes in each of the precursor sheets 11a, 11b and 11c. Here, so long as the precursor sheets 11a, 11b and 11c have glass transition temperatures within the range of −20° to 40° C., the precursor sheets 11a, 11b and 11c have excellent stamping workability, and the precursor sheets 11a, 11b, 11c, etc. do not suffer from deformation or cracking when stamped.

Then, as illustrated in FIG. 2C, the metal paste to be processed into the wiring conductor 2 is print-coated on the upside and underside of the semiset precursor sheets 11b and 11c, and the inside of the through-holes B and B' in a predetermined pattern by the well-known screen printing method and filling method of the prior art, and the composite is semiset by heating at a temperature from about 25 to about 100° C. for 1–60 minutes. Here, so long as the precursor sheets 11a, 11b and 11c have glass transition temperatures within the range of −20° to 40° C., the printability of the metal paste 12 on the precursor sheets 11a, 11b and 11c is excellent, and the metal paste 12 may be printed in a predetermined pattern with high precision.

The metal paste 12 to be processed into the wiring conductor 2 may be a paste which is prepared by mixing a copper powder having a particle size on the order of 0.1–20 μm, with an epoxy resin such as a bisphenol A-type epoxy resin, novolac-type epoxy resin or glycidyl ester-type epoxy resin, and a curing agent such as an amine-based curing agent, imidazole-based curing agent or acid anhydride-based curing agent added thereto.

Finally, the three semiset precursor sheets 11a, 11b and 11c are vertically laminated and heated at a temperature from about 80 to about 300° C. for about 10 seconds to 24 hours to completely thermoset the precursor sheets 11a, 11b and 11c, and the metal paste 12 print-coated on the precursor sheets 11b and 11c in the predetermined pattern, thereby completing a wiring board comprising the insulating substrate 1 with the wiring conductor 2 attached thereto by coating, as illustrated in FIG. 1. Here, the precursor sheets 11a, 11b and 11c and the metal paste 12 hardly shrink when thermoset, and therefore the resulting wiring board hardly suffers from deformation or variation in size. The semiconductor element and wiring conductor are thus connected to each other with precision.

[Other examples]

When an ultraviolet-Raysetting, thermosetting resin is used as the thermosetting resin to be incorporated in the wiring conductor 2, the metal paste 12 to be processed into the wiring conductor 2 is print-coated on the upside and underside of the precursor sheets 11b and 11c, and the inside of the through-holes B and B' in a predetermined pattern by the well-known screen printing method of the prior art, and semiset by ultraviolet irradiation. The metal paste 12 is, for example, a paste which is prepared by mixing a copper powder having a particle size of 0.1–20 μm as the metal powder, with an epoxy-modified acrylate resin.

In addition, since the metal paste 12 print-coated on the precursor sheets 11b and 11c has been semiset by ultraviolet irradiation, the pattern of the metal paste 12 cannot be deformed when the three precursor sheets 11a, 11b and 11c and the metal paste 12 print-coated on the respective precursor sheets in the predetermined pattern are thermally set to prepare a wiring board comprising the insulating substrate 1 with the wiring conductor 2 attached thereto by coating, as described later. As a result, even when a plurality of patterns of the metal paste 12 are print-coated on the precursor sheets 11b and 11c in close proximity to each other, there is no risk of bringing the adjacent patterns into contact with each other and establishing a short circuit, thus allowing high-density patterns of the metal paste 12 to be formed on the precursor sheets 11b and 11c.

The metal paste 12 print-coated on the precursor sheets 11b and 11c is brought into a semiset state by irradiation with an integrated amount of 200–1,600 m.J/cm$^2$ of ultraviolet rays.

In cases where the metal paste 12 is composed of a powder of a high-melting-point metal and a powder of a low-melting-point metal having a melting point of 300° C. or lower, or a powder of a high-melting-point metal the surface of which is coated with a low-melting-point metal having a melting point of 300° C. or lower, and a thermosetting resin precursor, the metal paste 12 to be processed into the wiring conductor 2 is print-coated on the upsides and undersides of the precursor sheets 11b and 11c and the insides of the through-holes B and B' in a predetermined pattern by the well-known screen printing of the prior art, and the metal paste 12 print-coated in the predetermined pattern is heated by induction heating to bond the particles of the powder of a high-melting-point metal with the low-melting-point metal, followed by heating at a temperature from about 25 to about 100° C. for 1–60 minutes to semiset the thermosetting resin. The metal paste 12 available for use includes, for example, a paste which is prepared by mixing a copper powder having a particle size on the order of 0.1–20 μm as the metal powder with a powder of a low-melting-point metal comprising tin which has a particle size on the order of 0.1–20 μm at a weight ratio of the copper powder to the powder of a low-melting-point metal being 95:5 to 5:9.5, and a paste which is prepared by mixing a powder of a low-melting-point metal comprising lead-tin eutectic solder which has a particle size on the order of 1–50 μm, with a conductive, thermosetting resin precursor which incorporates an epoxy resin such as a bisphenol A-type epoxy resin, novolac-type epoxy resin or glycidyl ester-type epoxy resin, and a conductive polyacetylene resin or polyphenylene resin, together with a curing agent, such as, an amine-based curing agent, imidazole-based curing agent or acid anhydride-based curing agent. The heating by induction heating is performed by placing the precursor sheets 11b and 11c with the predetermined pattern of the metal paste 12 print-coated thereon, in the heating-coil portion of a high-frequency brazing apparatus, and applying high-frequency power to the heating coil which is necessary to produce heat in the low-melting-point metal in the metal paste by electromagnetic induction.

Subsequently, the three semiset precursor sheets 11a, 11b and 11c are vertically laminated and heated at a temperature from about 80 to about 300° C. (preferably in an inert atmosphere) for 10 seconds to 24 hours, to melt the low-melting-point metal which is contained in the predetermined pattern of the metal paste 12 applied by print coating, thereby joining the particles of the powder of a high-melting-point metal with the melted low-melting-point metal, and concurrently to completely thermoset the thermosetting resin precursors of the precusor sheets 11a, 11b and 11c and the thermosetting resin precusor of the metal paste 12 for an integration thereof, thus completing a wiring board constructed of the insulating substrate 1 coated with the wiring board 2, as illustrated in FIG. 1. Here, since the heat treatment temperature is 300° C., it is possible to melt the low-melting-point metal to thereby join the particles of the powder of a high-melting-point metal with the low-melting-point metal without thermally decomposing the thermosetting resins of the precusor sheets 11a, 11b and 11c. When the metal paste 12 is composed of a powder of a low-melting-point metal having a melting point of 300° C. or lower and a thermosetting resin precursor, the powder of a low-melting-point metal melts to join the particles of the powder when the thermosetting resin precursor of the wiring pattern is thermoset in the same manner as described above.

In addition, when a solderability promoter is contained in the metal paste 12 in order to increase solderability of the powder of a low-melting-point metal having a melting point of 300° C. or lower for the powder of a high-melting-point metal (e.g., copper), a solderability promoter comprising rosin flux or a fatty acid is used as the solderability promoter. The solderability promoter used in the metal tends to lower the solderability of the solder for the copper powder when its content is less than 0.1% by weight of the total amount of the metal paste, whereas the electrical resistance of the wiring conductor increases when the content exceeds 20% by weight. Accordingly, the content of a solderability promoter in the metal paste 12 preferably is within the range of 0.1–20% by weight of the total amount of the metal paste 12.

The inert atmosphere at 80–300° C., in which the three precursor sheets 11a, 11b and 11c print-coated with the predetermined pattern of the metal paste 12 are placed, is produced by heating an inert solution, for example, one called Garden (trade name of Aujimont, Inc., Italy) with a heater and using the resulting vapor phase. Since it is easy to control the temperature of the inert atmosphere produced by using the vapor phase from an inert solution, it is advantageous to adjust the temperature of the atmosphere to the predetermined temperature to thermally set the thermosetting resin precursors of the three precursor sheets 11a, 11b and 11c, and the thermosetting resin precursor of the metal paste 12 while reliably joining the particles of the powder of the metal paste 12 with the low-melting-point metal and reliably joining the particles of the low-melting-point metal to each other.

In addition, the incorporation of at least one member selected from the group consisting of a fatty acid and a metal salt thereof, a metal-chelating agent, and an oxydicarboxylic acid and an aminodicarboxylic acid and metal salts of the foregoing two acids in the metal paste 12 to be processed into the wiring conductor 2 facilitates the melting and flowing of the low-melting-point metal which coats the surface of the powder of a high-melting-point metal (e.g., copper powder or silver powder) when the metal paste 12 is thermally treated to form the wiring conductor 2. As a result, excellent joints are formed between the particles of the powder of a high-melting-point metal by means of the low-melting-point metal, and this results in lower electrical resistance of the wiring conductor 2. Here, in cases where at least one member selecting from the group consisting of a fatty acid and a metal salt thereof, a metal-chelating agent, an oxydicarboxylic, acid and an aminodicarboxylic acid and metal salts of the foregoing two acids comprises more than 1.0% by weight of the total amount of the metal paste 12, the at least one member remains in the wiring conductor 2 in a high proportion, which could increase the electrical resistance of the wiring conductor 2. On the other hand, the melting and flowing of the low-melting-point metal cannot be facilitated when the content is lower than 0.01% by weight, which could make it difficult to satisfactorily join the particles of the powder of a high-melting-point metal by means of the low-melting-point metal. Accordingly, the content of the at least one member selected from the group consisting of a fatty acid and a metal salt thereof, a metal-chelating agent, an oxydicarboxylic acid, an aminodicarboxylic acids and metal salts of the foregoing two acids which is incorporated in the metal paste 12 preferably is within the range of 0.01–1.0% by weight of the total amount of the metal paste 12.

The application or incorporation of a non-solvent type diluent, for example, a glycidyl amine such as o-toluidine or aniline, to or in the metal paste 12 to be processed into the wiring conductor 2 results in reduction of the viscosity of the thermosetting resin precursor, and ease of melting and flowing the low-melting-point metal which coats the surface of the powder of the high-melting-point metal and eventually joining the particles of the powder of the high-melting-point metal with the low-melting-point metal in a satisfactorily manner, thus lowering the electrical resistance of the wiring conductor 2 when the metal paste 12 is thermally treated to join the particles of the powder of the high-melting-point metal with the low-melting-point metal and concurrently to thermally set the thermosetting resin precusor to provide the wiring conductor 2. When the content of the non-solvent type diluent exceeds 10% by weight of the total amount of the metal paste 12, the strength of the wiring conductor 2 decreases, and the adhesion between the wiring conductor 2 and the insulating plates 1b and 1c is impaired, which could cause the wiring conductor 2 to peel off from the insulating plates 1b and 1c. On the other hand, when the content is less than 0.1% by weight, the viscosity of the metal paste 12 cannot be satisfactorily lowered, and this may prevent the low-melting-point metal which coats the surface of the powder of the high-melting-point metal from readily melting and flowing to satisfactorily join the particles of the powder of the high-melting-point metal with the low-melting-point metal. Accordingly, the content of the non-solvent diluent in the metal paste 12 preferably is within the range of 0.1–10% by weight of the total amount of the metal paste 12.

A thermosetting binder (e.g., epoxy-modified acrylate or carboxylic acid-modified acrylate) may be incorporated in the thermosetting resin to prepare the three precusor sheets 11a, 11b and 11c.

Here, in cases where the contents of the thermosetting binder such as an epoxy-modified acrylate or carboxylic acid-modified acrylate in the three precusor sheets 11a, 11b and 11c are within the range of 2–10% by weight, the glass transition temperatures of the precusor sheets 11a, 11b and 11c are held within the range of −20° to 40° C., which serves to improve their stamping workability and the printability of the metal paste. This prevents the precusor sheets 11a, 11b and 11c from deforming or cracking when stamped, and allows high-precision printing of a predetermined pattern of the metal paste on the precusor sheets 11a, 11b and 11c, etc.

As described above, a wiring board comprising the insulating substrate 1 free from deformation and variation in size may be provided by the method of manufacturing a wiring board according to the invention.

Although the wiring substrates are manufactured by laminating three precusor sheets in the several examples given above, the wiring boards may be manufactured using one, two, four or more precusor sheets.

In conclusion, the present invention should not be interpreted to be limited to the examples described above, and a variety of modifications and changes may be made in the invention without departing from the spirit of the invention. For example, although being described in the foregoing Examples with reference to the case where the wiring board according to the invention is used in a package for housing a semiconductor element, the invention may be applied to the manufacture of wiring boards for use in hybrid circuits, etc.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A wiring board comprising:
    an insulating substrate comprising 60–95% by weight of a powder of an inorganic insulating material and 5–40% by weight of a thermosetting resin, wherein the powders of an inorganic insulating material are bonded with the thermosetting resin to form the insulating substrate; and
    wiring conductors comprising 70–95% by weight of a metal powder and 5–30% by weight of a thermosetting resin, the wiring conductors being integrally attached to the insulating substrate by coating.

2. The wiring board according to claim 1, wherein the powder of an inorganic insulating material comprises a powder of at least one member selected from the group consisting of calcium titanate, silicon oxide, aluminum oxide, aluminum nitride, silicon carbide, barium titanate, strontium titanate, titanium oxide and zeolite.

3. The wiring board according to claim 1, wherein the powder of an inorganic insulating material has a particle size within the range of 0.1–100 $\mu$m.

4. The wiring board according to claim 1, wherein the thermosetting resin of the insulating substrate comprises at least one member selected from the group consisting of an epoxy resin, a phenol resin, a polyimide resin and a polyphenylene ether resin.

5. The wiring board according to claim 4, wherein the thermosetting resin of the insulating substrate is an epoxy resin which comprises at least one member selected from the group consisting of a bisphenol A epoxy resin, a novolac-type epoxy resin, and a glycidyl ester-type epoxy resin.

6. The wiring board according to claim 1, wherein the thermosetting resin of the insulating substrate has an ultraviolet-Raysetting property.

7. The wiring board according to claim 1, wherein the therosetting resin of the wiring conductors is substantially the same as the thermosetting resin of the insulating substrate.

8. The wiring board according to claim 1, wherein the thermosetting resin of the wiring conductors has an electrically conductive property.

9. The wiring board according to claim 1, wherein the metal powder of the wiring conductors has a particle size of 0.1–50 $\mu$m and comprises a powder of at least one member selected from the group consisting of copper, silver and gold, with portions of the respective particles being joined by contact with each other.

10. The wiring board according to claim 1, wherein the metal powder of the wiring conductors comprises a powder of first metal particles joined with particles of a second metal having a melting point of 300° C. or lower, wherein the melting point of the second metal is lower than a melting point of the first metal.

11. The wiring board according to claim 10, wherein the second metal comprises at least one member selected from the group consisting of a tin-indium alloy, a tin-zinc alloy, a tin-bismuth alloy, a lead-tin alloy and tin-silver alloy.

12. The wiring board according to claim 1, wherein the metal powder of the wiring conductors comprises a copper core with a particle size of 0.5–50 $\mu$m which is coated with a coating layer 0.5–50 $\mu$m thick of at least one member selected from the group consisting of silver, gold, platinum and palladium, or with a coating layer 0.01–10 $\mu$m thick of at least one member of aluminum and nickel, with portions of the respective particles of the powder being in contact with each other, or being joined with a low-melting-point metal having a melting point of 300° C. or lower.

13. The wiring board according to claim 1, wherein the metal powder of the wiring conductors is squamiform.

14. The wiring board according to claim 1, wherein the metal powder of the wiring conductors comprises an alloy of at least two elemental metals.

15. The wiring board according to claim 1, wherein the wiring conductors comprise first metal particles joined with melted particles of a second metal, wherein the first metal and the second metal have different compositions, and wherein the second metal has a melting point lower than a melting point of the first metal.

16. The wiring board according to claim 15, wherein the thermosetting resin of the wiring conductors is characterized by complete curing below the melting point of the second metal.

17. The wiring board according to claim 15, wherein the second metal is a solder.

18. The wiring board according to claim 15, wherein the second metal comprises at least one member selected from the group consisting of a tin-indium alloy, a tin-zinc alloy, a tin-bismuth alloy, a lead-tin alloy and tin-silver alloy.

19. The wiring board according to claim 14, wherein the at least two elemental metals comprise at least one of copper, gold and silver.

20. The wiring board according to claim 14, wherein the at least two elemental metals comprise at least one of germanium, praseodymium, antimony and bismuth.

21. The wiring board according to claim 1, wherein the wiring conductors define a pattern on a face of the insulating substrate, the pattern extending from a central portion of the insulating substrate to an array of distinct ending points displaced from the central portion of the insulating substrate toward a periphery of the insulating substrate.

22. The wiring board according to claim 21, wherein the insulating substrate comprises a plurality of individual insulating sheets and wherein the pattern is provided on a face of one of the individual insulating sheets.

23. The wiring board according to claim 22, wherein the pattern extends partially between two of the individual sheets.

24. The wiring board according to claim 23, wherein the array of distinct ending points corresponds to an array of holes extending through one of the individual sheets.

25. The wiring board according to claim 21, wherein the array of distinct ending points corresponds to an array of holes extending at least partially through the insulating substrate, walls of the holes coated with the wiring conductors.

26. The wiring board according to claim 22, wherein an individual sheet having an opening therein extends above the face of the one of the individual insulating sheets.

* * * * *